United States Patent
Sato et al.

(10) Patent No.: US 9,247,646 B2
(45) Date of Patent: Jan. 26, 2016

(54) ELECTRONIC COMPONENT BUILT-IN SUBSTRATE AND METHOD OF MANUFACTURING THE SAME

(71) Applicant: SHINKO ELECTRIC INDUSTRIES CO., LTD., Nagano-shi, Nagano (JP)

(72) Inventors: Junji Sato, Nagano (JP); Tomohiro Nomura, Nagano (JP); Kazuhiro Oshima, Nagano (JP)

(73) Assignee: SHINKO ELECTRIC INDUSTRIES CO., LTD., Nagano-Shi (JP)

( * ) Notice: Subject to any disclaimer, the term of this patent is extended or adjusted under 35 U.S.C. 154(b) by 211 days.

(21) Appl. No.: 13/904,447

(22) Filed: May 29, 2013

(65) Prior Publication Data
US 2013/0319740 A1  Dec. 5, 2013

(30) Foreign Application Priority Data

May 30, 2012  (JP) .................................. 2012-122588

(51) Int. Cl.
*H05K 1/18*  (2006.01)
*H05K 3/46*  (2006.01)

(52) U.S. Cl.
CPC .............. *H05K 1/185* (2013.01); *H05K 3/4602* (2013.01); *H05K 3/4652* (2013.01); *H05K 2201/0195* (2013.01); *H05K 2201/10636* (2013.01); *H05K 2203/0191* (2013.01)

(58) Field of Classification Search
CPC ........ H05K 1/18; H05K 1/185; H05K 3/4602
USPC ........................................... 174/258; 361/761
See application file for complete search history.

(56) References Cited

U.S. PATENT DOCUMENTS

| | | | |
|---|---|---|---|
| 2009/0237900 A1* | 9/2009 | Origuchi et al. | 361/763 |
| 2011/0108971 A1* | 5/2011 | Ewe et al. | 257/686 |

FOREIGN PATENT DOCUMENTS

JP    2011-216740    10/2011

* cited by examiner

*Primary Examiner* — Timothy Thompson
*Assistant Examiner* — Charles Pizzuto
(74) *Attorney, Agent, or Firm* — Rankin, Hill & Clark LLP

(57) ABSTRACT

An electronic component built-in substrate comprises a substrate having a core member with an opening in which an electronic component is disposed, a first auxiliary insulating layer formed on a first surface of the core member; a second auxiliary insulating layer formed on a second surface of the core member, the second auxiliary insulating layer having a first via hole, a filling resin portion filling a gap between the electronic component and a side surface of the opening of the core member, and a first wiring layer formed on the second auxiliary insulating layer and connected to the connection terminal of the electronic component through the first via hole. The whole of the first surface and the whole of the second surface of the core member are in direct contact with the first auxiliary insulating layer and the second auxiliary insulating layer, respectively.

7 Claims, 12 Drawing Sheets

ELECTRONIC COMPONENT BUILT-IN SUBSTRATE AND METHOD OF MANUFACTURING THE SAME

CROSS-REFERENCE TO RELATED APPLICATION(S)

The present application claims the benefit of priority of Japanese Patent Application No. 2012-122588, filed on May 30, 2012. The disclosures of this application are incorporated herein by reference.

BACKGROUND

1. Technical Field

The present disclosure relates to an electronic component built-in substrate and a method of manufacturing the same.

2. Related Art

With the recent development of electronic device, a wiring board for an electronic component device used in electronic device is required to be miniaturized and improved in performance and satisfies other requirements. To satisfy those requirements, electronic component built-in substrates have been put into practical use in which an electronic component is incorporated in a wiring board.

For example, in such an electronic component built-in substrate, an electronic component is disposed in an opening of a core substrate and build-up wirings are formed on both surfaces of the core substrate.

PRIOR ART DOCUMENTS

Patent Documents

[Patent document 1] JP-A-2011-216740

As described later in the description of a preliminary technique, a related-art manufacturing process of an electronic component built-in substrate has a step of filling resin into the space around an electronic component that is disposed in an opening of a core substrate and temporarily attached to a temporary attachment tape by heat-pressing a resin film. Since the thickness of the core substrate is set greater than that of the electronic component, a large space needs to be filled with resin and hence it is necessary to heat-press a thick resin film with a strong pressing force.

This may cause an event that the electronic component is peeled off the temporary attachment tape and sealed in resin so as to be inclined in the opening of the core substrate. Furthermore, since a large space needs to be filled up, it is difficult to fill the space around the electronic component with resin with high reliability.

SUMMARY

Exemplary embodiments of the invention provide an electronic component built-in substrate and its manufacturing method which make it possible to mount an electronic component with high reliability.

An electronic component built-in substrate according to an exemplary embodiment comprises:
an electronic component having a connection terminal;
a substrate having a core member with an opening in which the electronic component is disposed, a first auxiliary insulating layer formed on a first surface of the core member; and
a second auxiliary insulating layer formed on a second surface of the core member, the second auxiliary insulating layer having a first via hole that reaches the connection terminal of the electronic component;
a filling resin portion filling a gap between the electronic component and a side surface of the opening of the core member; and
a first wiring layer formed on the second auxiliary insulating layer and connected to the connection terminal of the electronic component through the first via hole, wherein
the whole of the first surface and the whole of the second surface of the core member are in direct contact with the first auxiliary insulating layer and the second auxiliary insulating layer, respectively.

A manufacturing method of an electronic component built-in substrate, according to an exemplary embodiment, comprises:
forming an opening through a core member;
mounting an electronic component having a connection terminal in the opening of the core member;
forming a first auxiliary insulating layer on a first surface of the core member, and filling a gap between the electronic component and a side surface of the opening of the core member with a filling resin portion;
forming a second auxiliary insulating layer on a second surface of the core member;
forming a first via hole through the second auxiliary insulating layer so that the first via hole reaches the connection terminal of the electronic component; and
forming a first wiring layer on the second auxiliary insulating layer so that the first wiring layer is connected to the connection terminal of the electronic component through the first via hole, wherein
the whole of the first surface and the whole of the second surface of the core member are in direct contact with the first auxiliary insulating layer and the second auxiliary insulating layer, respectively, and the core member, the first auxiliary insulating layer, and the second auxiliary insulating layer constitute a substrate.

In the electronic component built-in substrate according to the exemplary embodiment, the thickness of the core member is approximately equal to that of the electronic component. Therefore, when the space around the electronic component which is disposed in the opening of the core member is filled up by heat-pressing a resin film, only a small space needs to be filled up.

As a result, the space around the electronic component can be filled with resin reliably without forming any interstices by heat-pressing a thin resin film with a weak pressing force. Since the pressing force that is produced in heat-pressing the resin film can be set low, the electronic component can be prevented from being inclined.

The core substrate can be given a desired thickness by compensating for the shortage of the thickness of the core member by forming the first auxiliary insulating layer and the second auxiliary insulating layer. This makes it possible to produce a core substrate having a desired thickness.

A thick first wiring layer is formed over the connection terminal of the electronic component with the via hole (formed through the second auxiliary insulating layer) interposed in between.

With this structure, when via holes are formed through a metal foil and an insulating layer made of prepreg that are formed on the first wiring layer by laser processing using a high power laser, the thick first wiring layer functions as a stopper layer for the laser processing. Thus, the connection terminal of the electronic component is not damaged.

DETAILED DESCRIPTION

Exemplary embodiments will be hereinafter described with reference to the accompanying drawings.

Figure 1A:
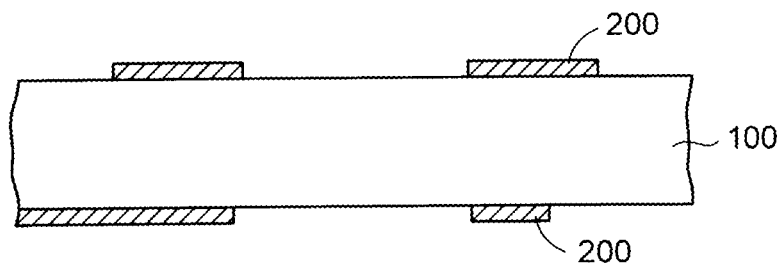
FIGS. 1A-1D are sectional views showing a manufacturing method of an electronic component built-in substrate according to the preliminary technique.

Before the description of the embodiment, a preliminary technique as a base of the invention will be described. In a manufacturing method of an electronic component built-in substrate according to the preliminary technique, as shown in FIG. 1A, first, a core substrate 100 is prepared whose two surfaces are formed with first wiring layers 200, respectively. The core substrate 100 is made of an insulative material such as a glass epoxy resin and is 0.6 mm in thickness.

Figure 1B:
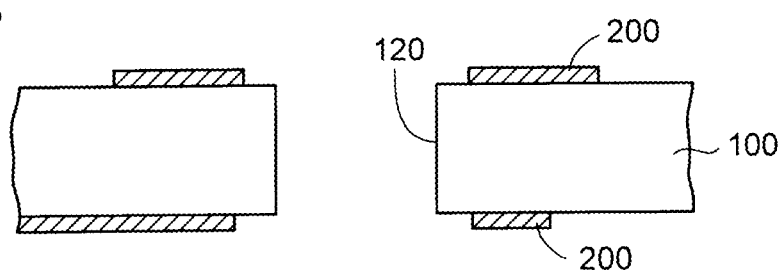

Then, as shown in FIG. 1B, an opening 120 is formed by a router, for example, so as to penetrate through the core substrate 100 in its thickness direction.

Figure 1C:
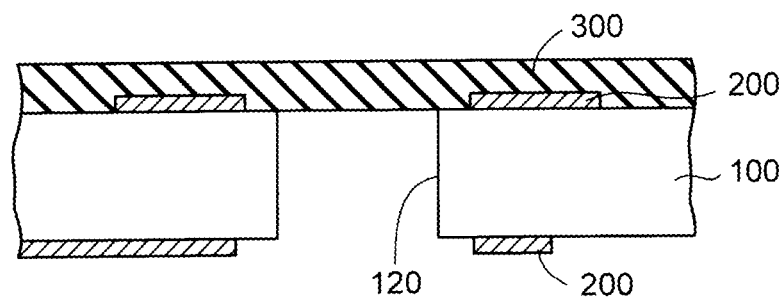
Figure 1D:
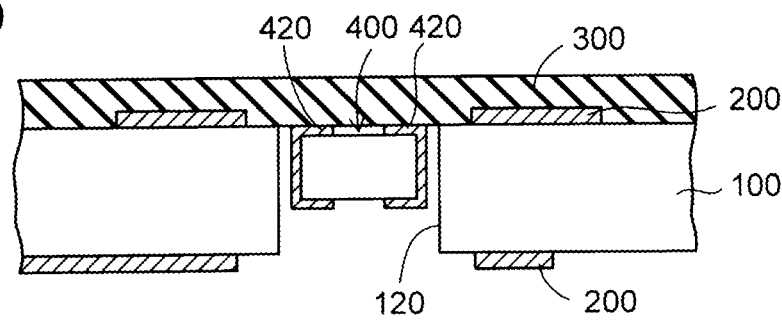

Then, as shown in FIG. 1C, an adhesive temporary attachment tape 300 is bonded to the top surface of the core substrate 100. Then, as shown in FIG. 1D, a chip capacitor 400 is temporarily bonded to a portion, covering the opening 120 of the core substrate 100, of the temporary attachment tape 300.

The chip capacitor 400 has a pair of connection terminals 420 on its two respective sides in the horizontal direction. The chip capacitor 400 is 0.5 mm in thickness and hence thinner than the core substrate 100 (0.6 mm)

Figure 2A:
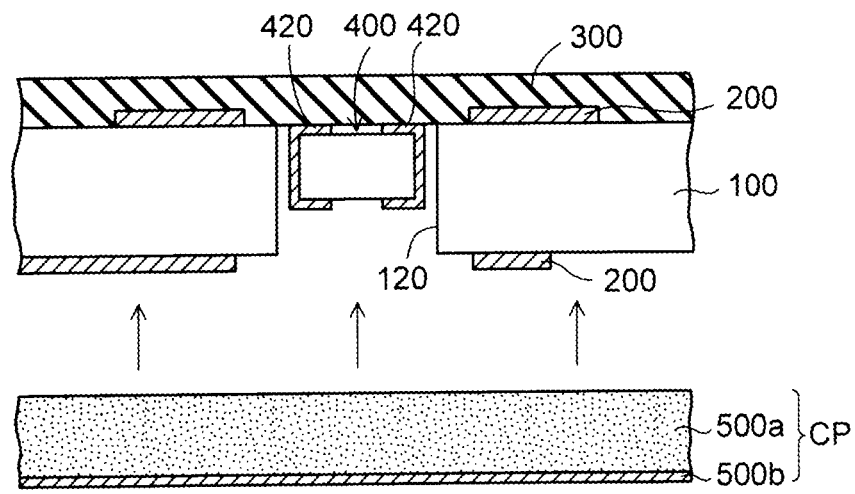
FIGS. 2A-2C are sectional views showing the manufacturing method of the electronic component built-in substrate according to the preliminary technique.

Then, as shown in FIG. 2A, a copper-foil-attached prepreg CP is prepared in which a copper foil 500b is bonded to one surface of a prepreg 500a. The prepreg 500a is an intermediate member in which a fiber reinforcement member made of glass fiber or the like is impregnated with an epoxy resin or the like.

Figure 2B:
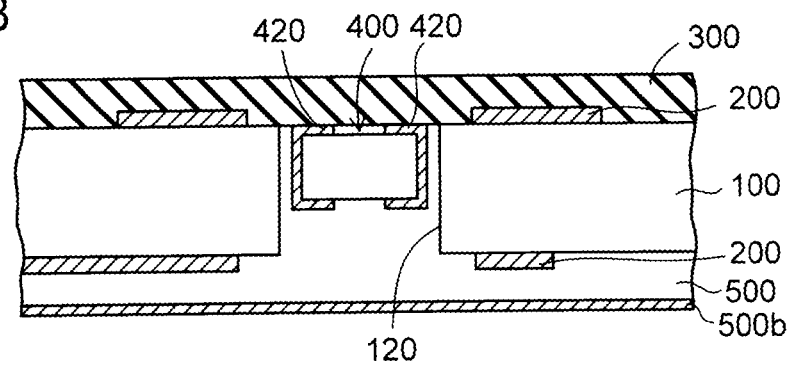

Then, as shown in FIGS. 2A and 2B, the prepreg 500a of the copper-foil-attached prepreg CP is laid on the bottom surface of the core substrate 100, and a resulting structure is subjected to die pressing while being subjected to a heat treatment.

As a result, the resin of the prepreg 500a is melted and part of it is filled into the opening 120 of the core substrate 100 and then the resin is cured. Therefore, the opening 120 in which the chip capacitor 400 exists is sealed by a first insulating layer 500 made of prepreg 500a. At the same time, a first insulating layer 500 is formed on the bottom surface of the core substrate 100 with the copper foil 500b bonded thereto.

Figure 2C:
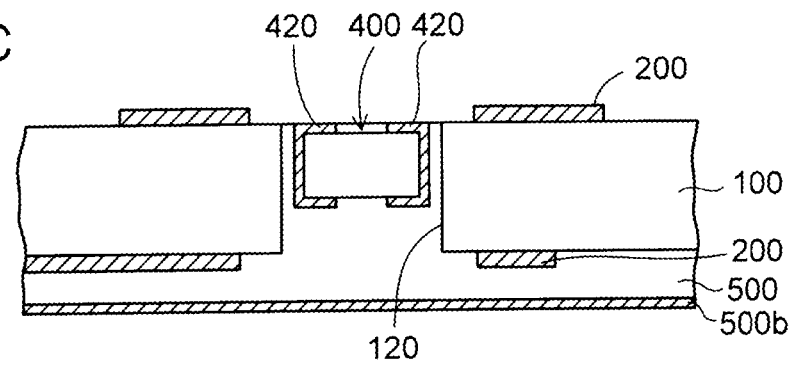

Then, as shown in FIG. 2C, the temporary attachment tape 300 is removed from the structure of FIG. 2B.

Figure 3A:
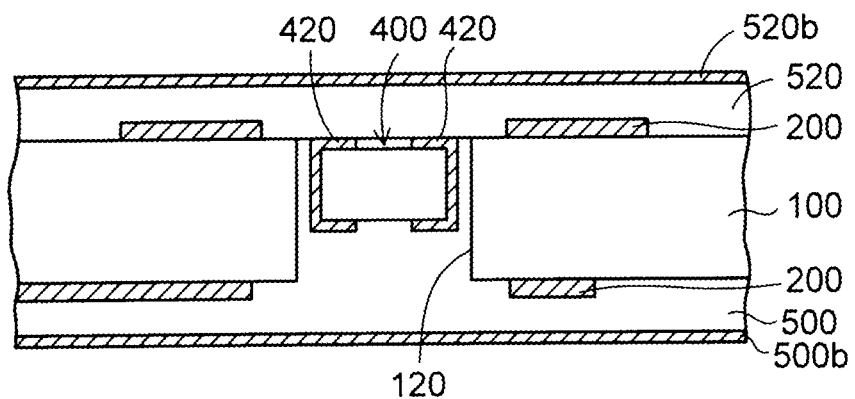
FIGS. 3A-3C are sectional views showing the manufacturing method of the electronic component built-in substrate according to the preliminary technique.

Then, as shown in FIG. 3A, another copper-foil-attached prepreg CP is laid on the top surface of the core substrate 100 and a resulting structure is subjected to die pressing while being subjected to a heat treatment, in the same manner as in the steps shown in FIGS. 2A and 2B. As a result, a second insulating layer 520 and a copper coil 520b are formed on the top surface of the core substrate 100 and the top surface of the chip capacitor 400 is covered with the second insulating layer 520.

Figure 3B:
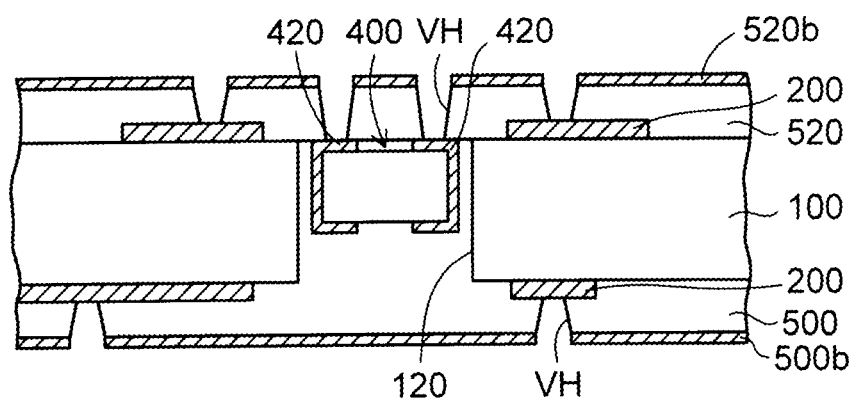

Subsequently, as shown in FIG. 3B, via holes VH are formed so as to reach the connection terminals 420 of the chip capacitor 400 and the first wiring layer 200 by performing laser processing on the copper foil 520b and the second insulating layer 520 from the top surface side of the core substrate 100.

Likewise, via holes VH are formed so as to reach the first wiring layer 200 which is formed on the bottom surface of the core substrate 100 by performing laser processing on the copper foil 500b and the first insulating layer 500 from the bottom surface side of the core substrate 100.

Figure 3C:
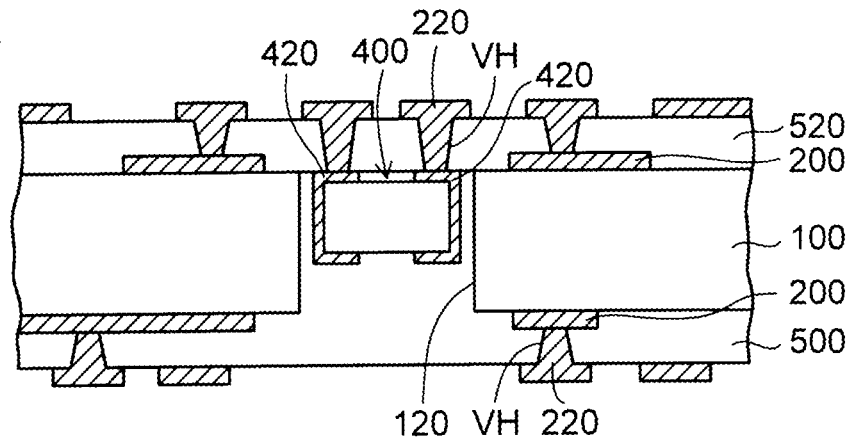

Then, as shown in FIG. 3C, on the top surface side of the core substrate 100, a second wiring layer 220 is formed on the second insulating layer 520 so as to be connected to the connection terminals 420 of the chip capacitor 400 and the first wiring layer 200 through the via holes VH. The second wiring layer 220 is formed so as to include the copper foil 520b.

Likewise, on the bottom surface side of the core substrate 100, another second wiring layer 220 is formed on the first insulating layer 500 so as to be connected, through the via holes VH, to the first wiring layer 200 which is formed on the bottom surface of the core substrate 100.

As described above, the multiple (two) wiring layers are formed on the two respective surfaces of the core substrate 100. An electronic component built-in substrate having a necessary number of multiple wiring layers can be manufactured by repeating similar steps.

Next, problems of the above-described manufacturing method of an electronic component built-in substrate according to the preliminary technique will be described. First, in the step shown in FIGS. 2A and 2B, the core substrate 100 is thicker than the chip capacitor 400 because the thickness of the former is adjusted so that requirements such as a one relating to impedance matching of a transmission path are satisfied. Therefore, when the opening 120 of the core substrate 100 is filled with part of the copper-foil-attached prepreg CP, a large space needs to be filled with resin, that is, a large amount of resin is necessary.

Figure 4A:
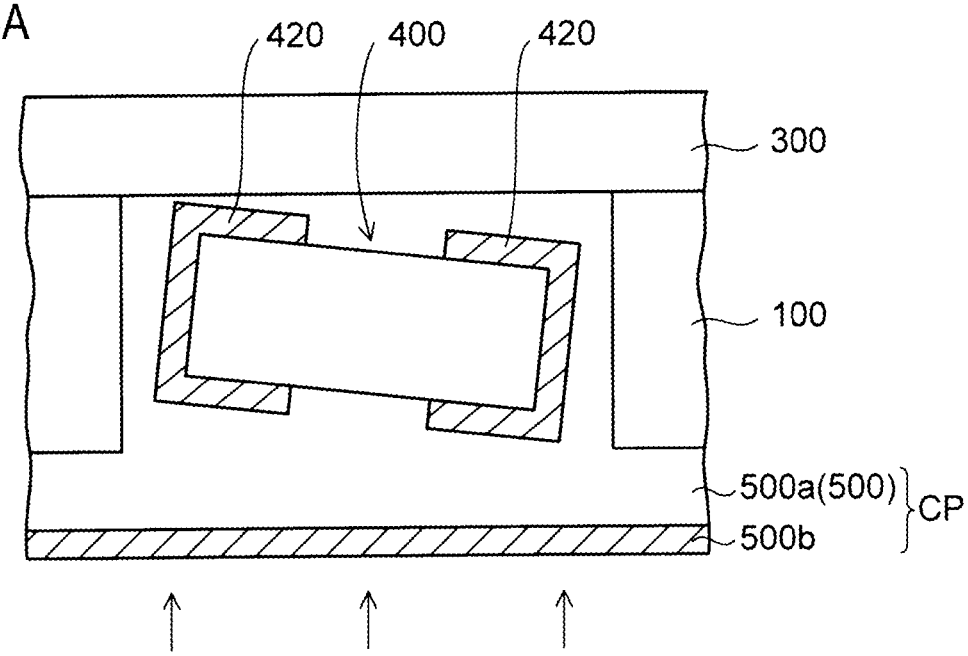
FIGS. 4A-4B are sectional views showing the problems of the manufacturing method of the electronic component built-in substrate according to the preliminary technique.

Therefore, as shown in FIG. 4A, it is necessary to prepare a copper-foil-attached prepreg CP having a thick prepreg 500a and subject it to heat pressing with a strong pressing force. This may cause an event that the chip capacitor 400 is peeled off the temporary attachment tape 300 and sealed in the first insulating layer 500 so as to be inclined in the opening 120 of the core substrate 100.

Furthermore, since a large space needs to be filled up, even if a copper-foil-attached prepreg CP having a thick prepreg 500a is used, it is difficult to fill the space around the chip capacitor 400 with resin without forming any interstices by one heat pressing attempt, resulting in low reliability.

Second, in the above-described step of forming via holes VH (see FIG. 3B), it is necessary to perform laser processing on the copper foil 520b and the second insulating layer 520 made of the prepreg containing the fiber reinforcement member (copper direct laser processing). Therefore, the laser processing power is set so high that the copper foil 520b and the second insulating layer 520 containing the fiber reinforcement member can be processed.

Figure 4B:
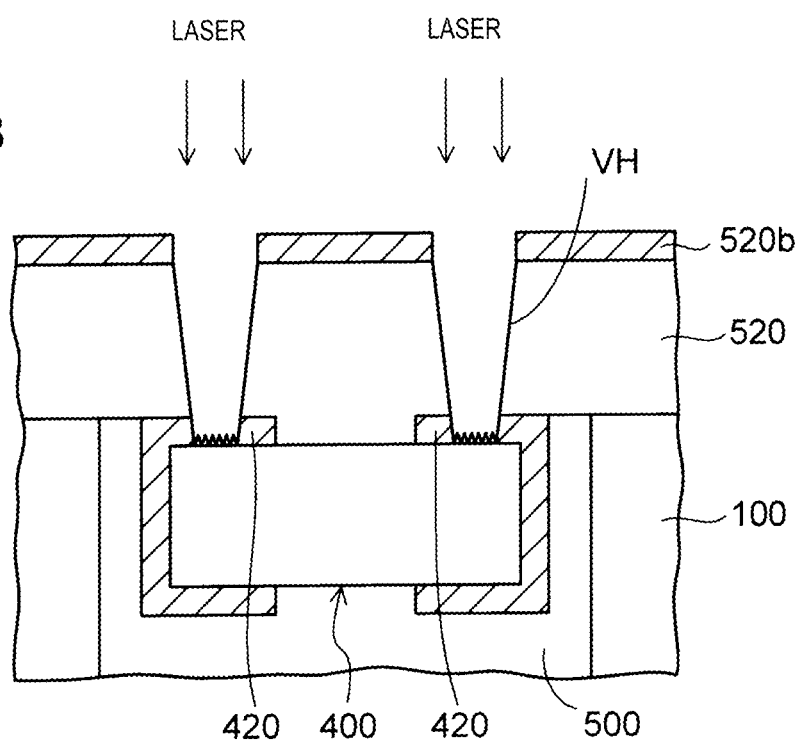

However, each connection terminal 420 of the chip capacitor 400 has a structure that a copper plating film of about 5 to 10 μm in thickness is formed on a copper paste sintered body of about 5 to 15 μm in thickness. Therefore, as shown in FIG. 4B, when via holes are formed by laser processing, the corresponding portions of the copper plating films of the connection terminals 420 of the chip capacitor 400 may become extremely thin or disappear.

Furthermore, when a second wiring layer 220 is formed by plating so as to be connected to the connection terminals 420 of the chip capacitor 400, the portions, located in the respective via holes VH, of the connection terminal 420 are made thinner by light etching which is preprocessing of the plating.

As described above, it is difficult to leave portions, located in the respective via holes VH, of the connection terminal 420 of the chip capacitor 400 in such a manner that they have sufficiently large thickness values. This results in a problem that the electrical connection between the chip capacitor 400 and the second wiring layer 220 is low in reliability.

The above-described problems can be solved by the embodiment described below.

(Embodiment)

FIGS. 5A-5E to FIGS. 9A-9C are sectional views showing a manufacturing method of an electronic component built-in substrate according to the embodiment. FIG. 10 is a sectional view of an electronic component built-in substrate according to the embodiment.

Figure 5A:
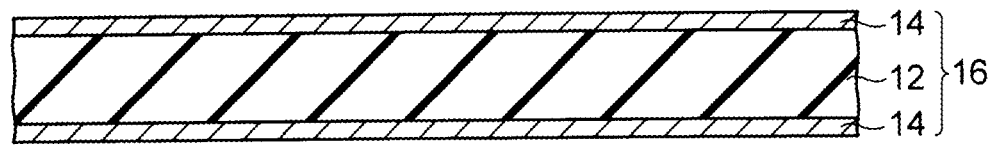
FIGS. 5A-5E are sectional views showing a manufacturing method of an electronic component built-in substrate according to an embodiment.

In the electronic component built-in substrate according to the embodiment, first, as shown in FIG. 5A, a copper-clad laminate 16 is prepared in which copper foils 14 are laid on the two respective surfaces of a core member 12.

Then, as shown in FIG. 5A, a single-layer core member 12 is produced by removing the top and bottom copper foils 14 from the copper-clad laminate 16. In this example, the thickness of the core member 12 is 0.5 mm and is approximately equal to the total thickness of a chip capacitor (described later).

The core member 12 is made of an insulative material such as a glass epoxy resin. Alternatively, the core member 12 may be a ceramic plate or a metal plate such as a copper plate.

Figure 5B:

Although in the steps of FIGS. 5A and 5B a core member 12 is produced by removing the copper foils 14 from the copper-clad laminate 16 which is a starting member. Alternatively, a glass epoxy resin substrate on which no copper foils are laid may be used as a core member 12. In the embodiment, the bottom surface and the top surface of the core member 12 may be referred to as a first surface and a second surface, respectively.

Figure 5C:
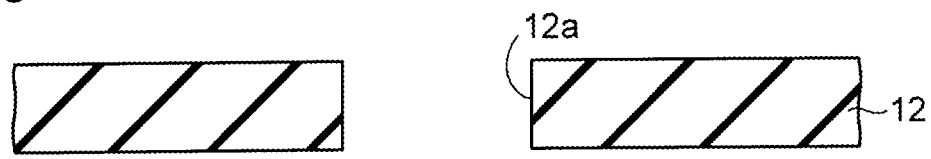

Then, as shown in FIG. 5C, an opening (called a cavity) 12a is formed by a router or a die pressing machine so as to penetrate through the core member 12 in its thickness direction. Where the core member 12 is a metal plate, if necessary, an insulating layer is formed on both surfaces of the metal plate including the opening 12a by resin electrodeposition, for example.

The opening 12a is formed through the core member 12 so as to be square, for example, in a plan view and one size larger than an electronic component to be mounted. Where a large core member 12 for manufacture of many products is used, openings 12a are formed in respective product regions defined.

Figure 5D:
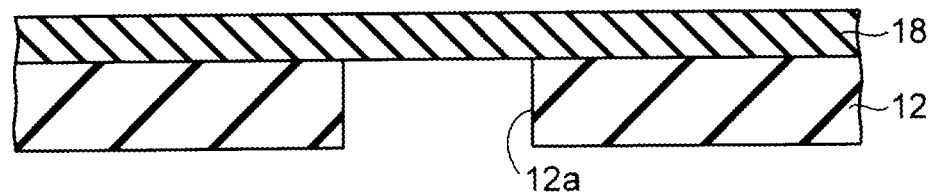
Figure 5E:
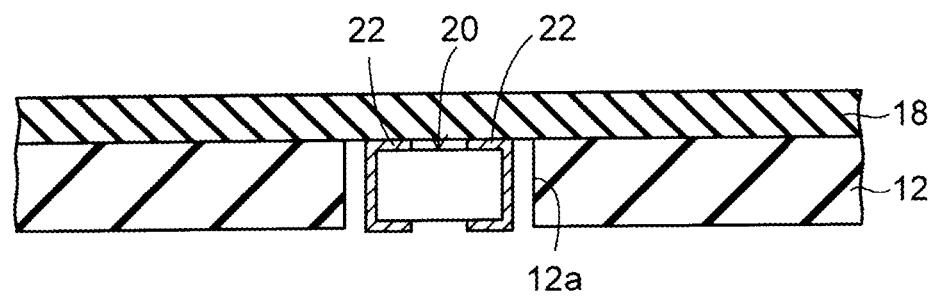

Then, as shown in FIG. 5D, an adhesive temporary attachment tape 18 is bonded to the top surface (second surface) of the core member 12. For example, the temporary attachment tape 18 is a resin film in which an insulating layer is formed on one surface of a PET (polyethylene terephthalate) film. Then, as shown in FIG. 5E, a chip capacitor 20 is temporarily bonded to a portion, covering the opening 12a of the core member 12, of the temporary attachment tape 18.

The chip capacitor 20 has a pair of connection terminals 22 on its two respective sides in the horizontal direction so as to be arranged in the direction that is parallel with the surfaces of the core member 12. Each connection terminal 22 extends so as to have a side portion and top and bottom end portions. The total thickness of the chip capacitor 20 is set at 0.5 mm so as to be approximately equal to the thickness of the core member 12.

As mentioned above, the thickness of the core member 12 is set approximately equal to the total thickness of the chip capacitor 20. It is preferable that the thickness of the core member 12 be set within ±20% of the total thickness of the chip capacitor 20 (electronic component), and it is even preferable that the thickness of the core member 12 be set within ±10% of the total thickness of the chip capacitor 20. Where the total thickness of the chip capacitor 20 is 0.5 mm, the thickness of the core member 12 is set in a range of 0.5 mm±50 μm).

An example of the chip capacitor 20 is a ceramic chip capacitor in which electrodes are provided at both ends, in the longitudinal direction, of a capacitor body having a rectangular parallelepiped shape.

Various other kinds of electronic components having connection terminals, such as a semiconductor chip, a resistor element, and an inductor element can be used in place of the chip capacitor 20.

Figure 6A:
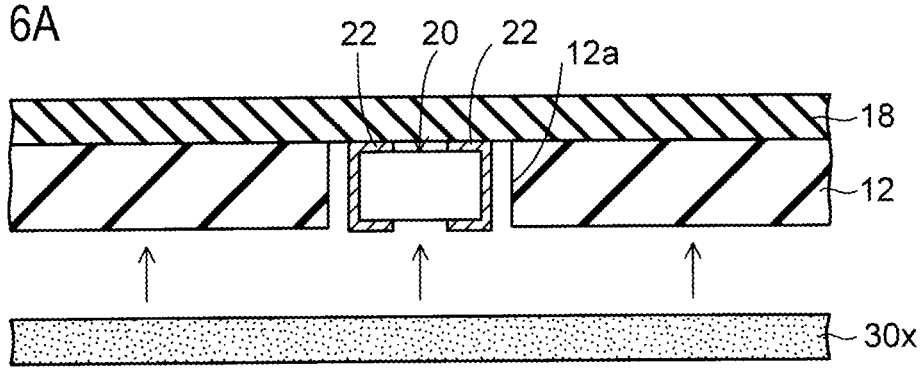
FIGS. 6A-6D are sectional views showing a manufacturing method of an electronic component built-in substrate according to an embodiment.

Then, as shown in FIG. 6A, a resin film 30x in a half-cured state (B stage) is prepared and laid on the bottom surface (first surface) of the core member 12 by a vacuum laminator having a heat press function. Example materials of the resin film 30x are an epoxy resin, a polyimide resin and the like.

The resin film 30x is cured by heat-pressing it at 150° C. to 190° C. via a protective film (not shown) such as a PET film, and the protective film is removed. The protective film is used to prevent the resin film 30x from sticking to the vacuum laminator in the heat pressing.

Figure 6B:
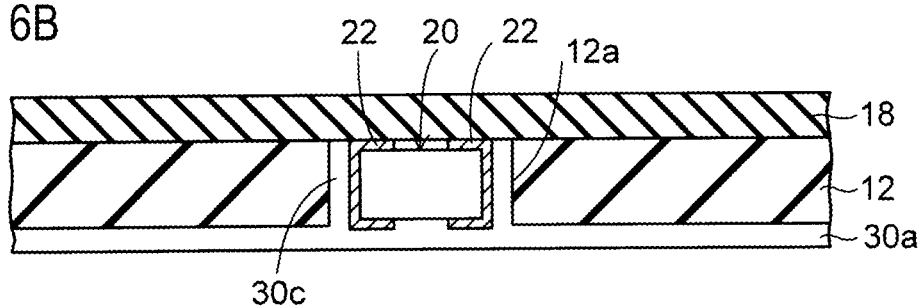

As a result, as shown in FIG. 6B, a first inner auxiliary insulating layer 30a is formed on the bottom surface of the core member 12. In this example, the thickness of the first inner auxiliary insulating layer 30a is set at 25 μm. The gap between the chip capacitor 20 and the inside surfaces of the opening 12a of the core member 12 is filled with a filling resin portion 30c of the first inner auxiliary insulating layer 30a to establish a state that the chip capacitor 20 is buried in the first inner auxiliary insulating layer 30a.

In the embodiment, the thickness of the core member 12 is set approximately equal to the total thickness of the chip capacitor 20. Therefore, when the chip capacitor 20 disposed in the opening 12a of the core member 12 is sealed by the resin, only a small space needs to be filled with resin, that is, only a small amount of resin is necessary.

Therefore, the space around the chip capacitor 20 can be filled with resin without forming any interstices by heat-pressing a thin resin film 30x with a weak pressing force.

Since the pressure acting on the chip capacitor 20 is low, the chip capacitor 20 can be prevented from being peeled off the temporary attachment tape 18 and inclined. Furthermore, the processing time of the step of laminating the resin film 30x can be shortened.

Although in the embodiment the temporary attachment tape 18 is bonded to the top surface of the core member 12 and the first inner auxiliary insulating layer 30a is formed on the bottom surface of the core member 12, an opposite arrangement is possible. That is, satisfactory results are obtained as long as the temporary attachment tape 18 is bonded to one of the top and bottom surfaces of the core member 12 and the first inner auxiliary insulating layer 30a is formed on the other (opposite) surface of the core member 12.

Figure 6C:
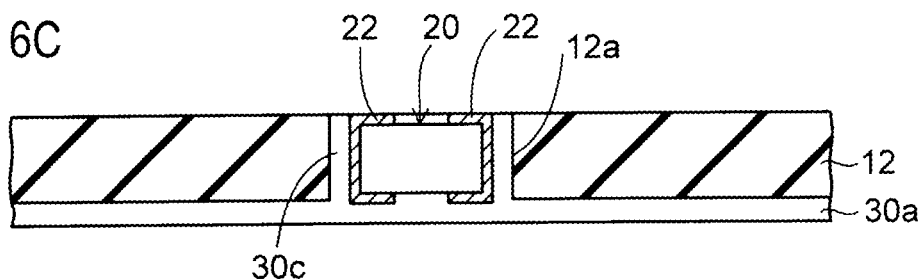

Then, as shown in FIG. 6C, the temporary attachment tape 18 is removed from the structure of FIG. 6B to expose the top surfaces of the core member 12 and the chip capacitor 20.

Figure 6D:
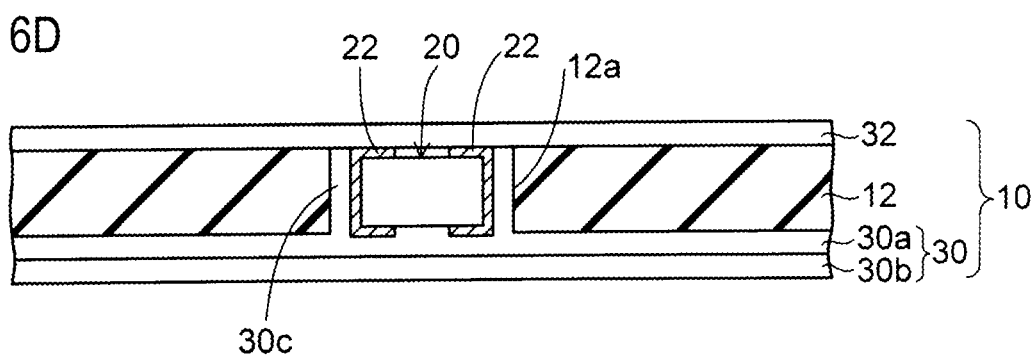

Then, as shown in FIG. 6D, a second auxiliary insulating layer 32 is formed on the top surface of the core member 12 by the same method as described with reference to FIGS. 6A and 6B, whereby the top surface of the chip capacitor 20 is covered. At the same time, a first outer auxiliary insulating layer 30b is formed on the first inner auxiliary insulating layer 30a which is formed on the bottom surface of the core member 12.

The first inner auxiliary insulating layer 30a and the first outer auxiliary insulating layer 30b constitute a first auxiliary insulating layer 30. In this example, the thickness of the second auxiliary insulating layer 32 is set at 50 μm and the thickness of the first outer auxiliary insulating layer 30b is set at 25 μm.

A description will now be made of why the first outer auxiliary insulating layer 30b is additionally formed on the first inner auxiliary insulating layer 30a. If the first outer auxiliary insulating layer 30b were not formed, the bottom surface of the first inner auxiliary insulating layer 30a is further subjected to a heat treatment when the second auxiliary insulating layer 32 is formed, as a result of which the surface roughness of the bottom surface of the first inner auxiliary insulating layer 30a would be made higher than that of the top surface of the second auxiliary insulating layer 32.

As described later, wiring layers will be formed on the first auxiliary insulating layer 30 and the second auxiliary insulating layer 32 by plating. In this step, the degrees of surface roughness of the first auxiliary insulating layer 30 and the second auxiliary insulating layer 32 will influence the adhesion and the pattern accuracy of wiring layers formed. Therefore, it is preferable that the surface roughness of the first auxiliary insulating layer 30 and the second auxiliary insulating layer 32 have the same, desired value.

Thus, the first auxiliary insulating layer 30 consisting of the first inner auxiliary insulating layer 30a and the first outer auxiliary insulating layer 30b are formed on the bottom surface of the core member 12 and the second auxiliary insulating layer 32 is formed on the top surface of the core member 12.

The entire bottom surface of the core member 12 is in direct contact with the first auxiliary insulating layer 30. Likewise, the entire top surface of the core member 12 is in direct contact with the second auxiliary insulating layer 32. A core substrate 10 is thus produced which consists of the core member 12, the first auxiliary insulating layer 30, and the second auxiliary insulating layer 32.

In wiring boards, the permittivity and the thickness of a core substrate are adjusted to optimum values so that requirements such as a one relating to impedance matching of a transmission path are satisfied. In the embodiment, to bury the chip capacitor 20 (disposed in the opening 12a of the core member 12) in resin easily with high reliability, the thickness of the core member 12 is set approximately equal to the total thickness of the chip capacitor 20.

Since this thickness of the core member 12 is smaller than its design thickness value for satisfying the requirements such as the one relating to impedance matching, the core substrate 10 is produced so as to have the above design thickness value by forming the first auxiliary insulating layer 30 and the second auxiliary insulating layer 32 on the two respective surfaces of the core member 12. In this example, the total thickness of the core substrate 10 is 0.6 mm and hence is greater than that of the chip capacitor 20 (0.5 mm)

As described above, the first auxiliary insulating layer 30 and the second auxiliary insulating layer 32 are laid on the core member 12 so as to produce the core substrate 10 having the desired thickness. Therefore, no wiring layer exists at each of the interfaces between the core member 12, the first auxiliary insulating layer 30, and the second auxiliary insulating layer 32 and the entire bottom surface and the entire top surface of the core member 12 are in direct contact with the first auxiliary insulating layer 30 and the second auxiliary insulating layer 32, respectively.

Since the core member 12, the first auxiliary insulating layer 30, and the second auxiliary insulating layer 32 constitute the core substrate 10, it is preferable that they be made of insulative materials having the same permittivity.

In the embodiment, the first inner auxiliary insulating layer 30a and the first outer auxiliary insulating layer 30b are formed on the bottom surface of the core member 12 so that the first auxiliary insulating layer 30 and the second auxiliary insulating layer 32 which are formed on the two respective surfaces of the core member 12 are set identical in surface roughness.

However, where no problems arise even if the first auxiliary insulating layer 30 and the second auxiliary insulating layer 32 which are formed on the two respective surfaces of the core member 12 are different from each other in surface roughness, it is not necessary to form the first outer auxiliary insulating layer 30b. Irrespective of whether the first outer auxiliary insulating layer 30b is formed or not, the thicknesses of the first auxiliary insulating layer 30 and the second auxiliary insulating layer 32 may be set arbitrarily to produce a core substrate 10 having a desired thickness.

Figure 7A:
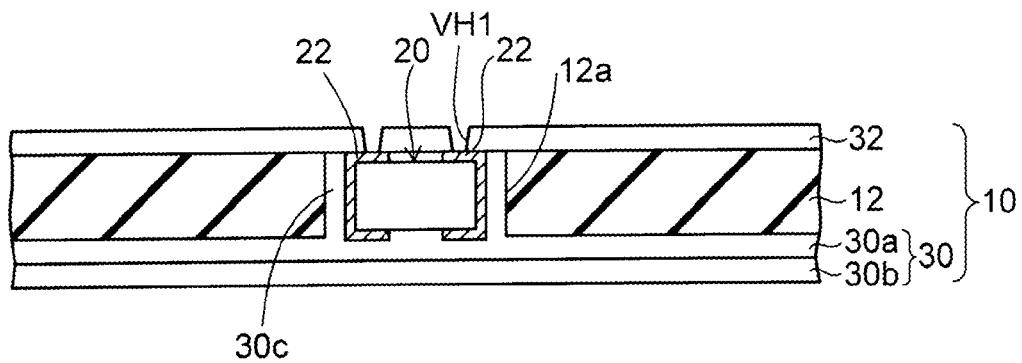
FIGS. 7A-7C are sectional views showing a manufacturing method of an electronic component built-in substrate according to an embodiment.

Then, as shown in FIG. 7A, first via holes VH1 are formed so as to reach the connection terminals 22 of the chip capacitor 20 by performing laser processing on the second auxiliary insulating layer 32 from the top surface side of the core member 12.

In this step, since only the second auxiliary insulating layer 32 which is made of a resin is laser-processed, the laser processing power can be set so low that almost no processing is performed on the connection terminals 22 of the chip capacitor 20.

Even where each connection terminal 22 of the chip capacitor 20 has a copper plating thin film of about 5 to 10 μm in thickness, portions corresponding to the first via holes VH1 of the copper plating thin films of the connection terminals 22 do not become extremely thin or disappear due to the laser processing. The fact that thickness of the second auxiliary insulating layer 32 can be set very small also contributes to preventing the connection terminals 22 of the chip capacitor 20 from being damaged by the laser processing.

Then, resin smears remaining in the first via holes VH1 are removed by desmearing of, for example, a permanganic acid method (cleaning).

Figure 7B:
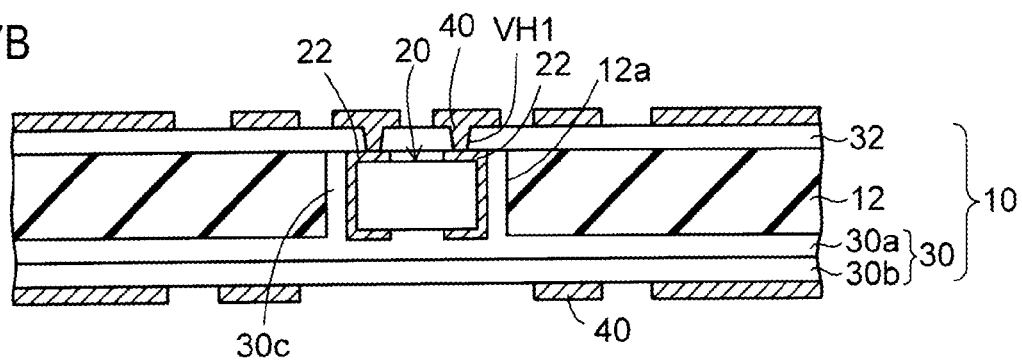

Then, as shown in FIG. 7B, on the top surface side of the core member 12, a first wiring layer 40 is formed on the second auxiliary insulating layer 32 so as to be connected to the connection terminals 22 of the chip capacitor 20 through the first via holes VH1. On the bottom surface side of the core member 12, a first wiring layer 40 is formed on the first auxiliary insulating layer 30. The thickness of the first wiring layer 40 is set at 15 to 50 µm and hence is much greater than the thickness (5 to 10 µm) of the copper plating films of the connection terminals 22 of the chip capacitor 20.

The first wiring layer 40 is formed by a subtractive method, for example. More specifically, on the top surface side of the core member 12, first, a seed layer (not shown) of copper, for example, is formed in the first via holes VH1 and on the second auxiliary insulating layer 32 by electroless plating. Then, a metal plating layer (not shown) of copper, for example, is formed on the seed layer by electrolytic plating using the seed layer as a plating electricity supply path.

A first wiring layer 40 is formed by patterning the metal plating layer and the seed layer by photolithography and etching. Any of other wiring forming methods such as a semi-additive method may be employed instead of the subtractive method. Another first wiring layer 40 is also formed on the bottom surface side of the core member 12 by a similar method.

Figure 7C:
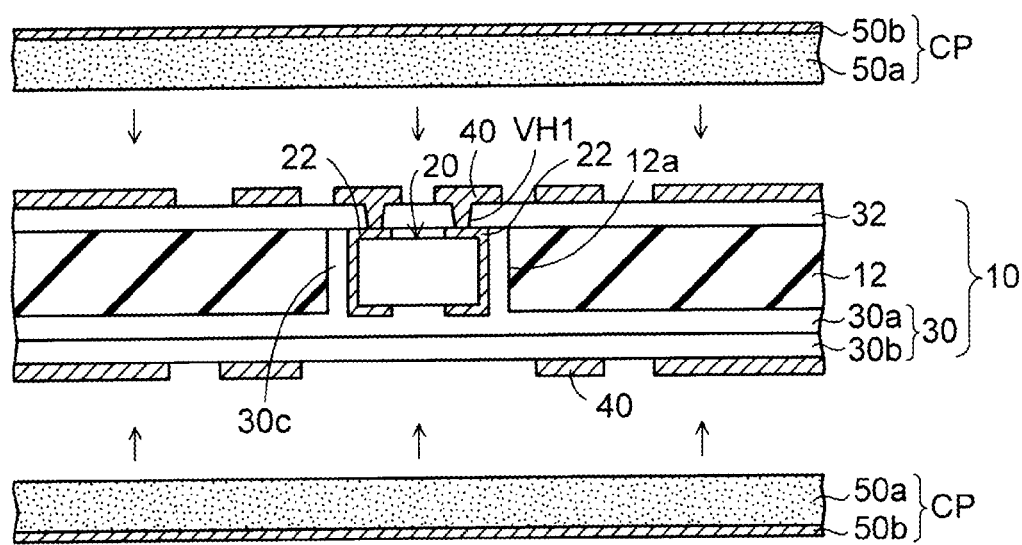

Subsequently, as shown in FIG. 7C, copper-foil-attached prepregs CP are prepared in each of which a copper foil 50b is bonded to one surface of a prepreg 50a. Each prepreg 50a is a member which is in a half-cured state (B stage) by heat-drying a thermosetting resin such as an epoxy resin that is impregnated in a fiber reinforcement member which is a woven cloth or unwoven cloth made of glass fiber, aramid fiber, carbon fiber, or the like. Alternatively, a resin containing fiber reinforcement member to which any of various kinds of metal foils other than the copper foil 50b is bonded can be used.

The copper-foil-attached prepregs CP are laid on the two respective surfaces of the structure of FIG. 7B and subjected to die pressing while being subjected to a heat treatment of 190° C. to 220° C.

The copper foil 50b of each copper-foil-attached prepreg CP not only prevents sticking of resin to the die when the prepreg 50a is heat-melted but also will be used later as part of a wiring layer.

Figure 8A:
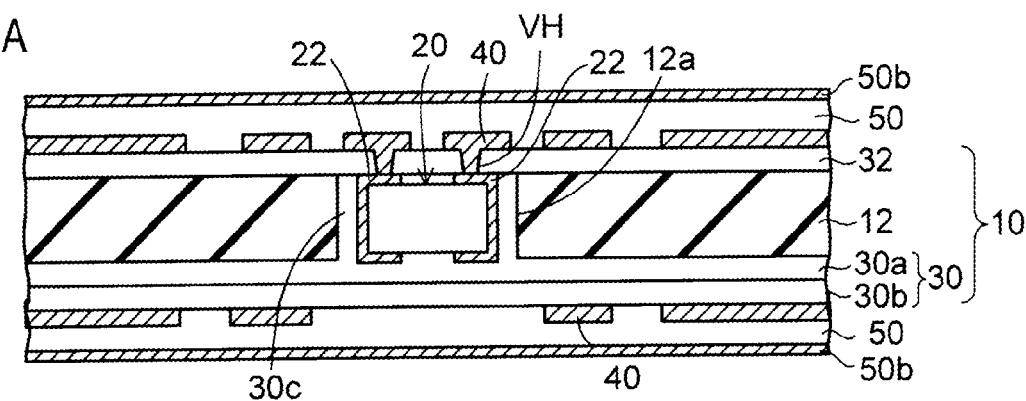
FIGS. 8A-8C are sectional views showing a manufacturing method of an electronic component built-in substrate according to an embodiment.

As a result, as shown in FIG. 8A, on the bottom surface side of the core member 12, a first insulating layer 50 made of prepreg 50a is formed on the first auxiliary insulating layer 30 and the first wiring layer 40. Likewise, on the top surface side of the core member 12, another first insulating layer 50 made of prepreg 50a is formed on the second auxiliary insulating layer 32 and the first wiring layer 40.

The first insulating layer 50 is formed on each surface side of the core member 12 in such a manner that the copper foil 50b is bonded to its outside surface.

For example, the thickness of the first insulating layer 50 is 50 to 100 µm and the thickness of the copper foil 50b is 10 to 35 µm.

In the example shown in FIGS. 7C and 8A, each first insulating layer 50 is formed by laying a copper-foil-attached prepreg CP. Alternatively, each first insulating layer 50 is formed by laying, in order, a prepreg and a copper foil that are separated from each other on each surface side of the core member 12 and applying heat and pressure to them.

Figure 8B:
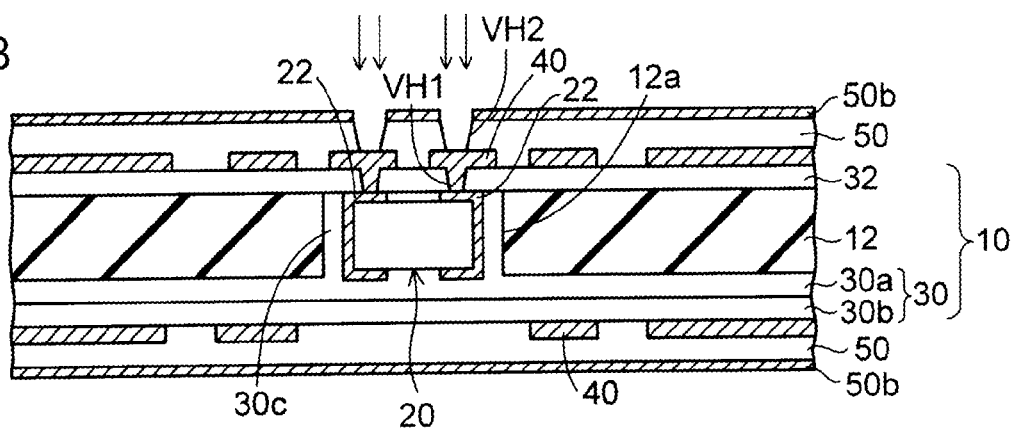

Then, as shown in FIG. 8B, on the top surface side of the core member 12, second via holes VH2 are formed so as to reach the first wiring layer 40 by laser-processing the copper foil 50b and the first insulating layer 50.

Since this is copper direct laser processing, the laser processing power is set so high that the copper foil 50b and the first insulating layer 50 made of prepreg 50a can be processed. Therefore, corresponding portions of the first wiring layer 40 are somewhat thinned through application of laser light when the second via holes VH2 are formed by the laser processing. However, since the first wiring layer 40 is sufficiently thick, the processed portions of the first wiring layer 40 never become too thin or disappear.

As described above, the first wiring layer 40 is formed over the connection terminals 22 of the chip capacitor 20 with the first via holes VH1 interposed in between. With this structure, the first wiring layer 40 functions as a stopper layer for the high-power laser processing when the second via holes VH2 are formed, whereby the connection terminals 22 of the chip capacitor 20 can be protected.

Although in the embodiment the first insulating layer 50 is formed using the copper-foil-attached prepreg CP, it may be formed using a resin film such as an epoxy resin. In this case, even if a thick resin film is laminated, via connection structures having a thick insulating layer can be formed with high reliability because the first wiring layer 40 functions as a stopper layer for laser processing.

Figure 8C:
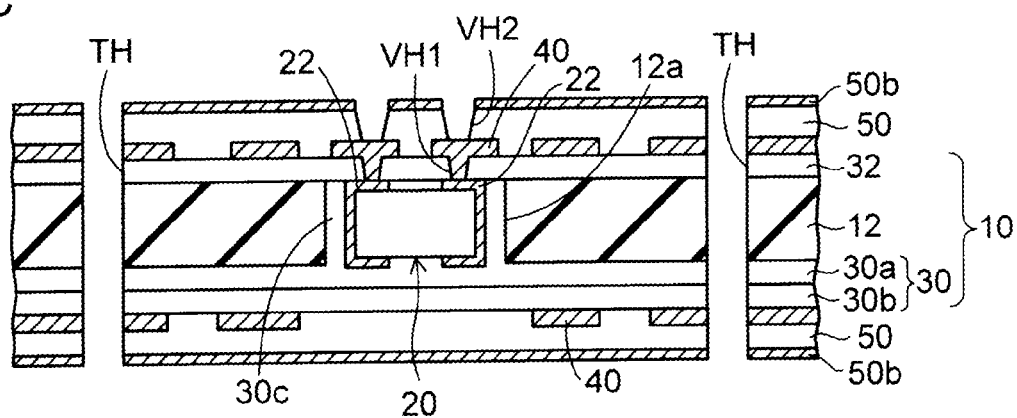

Then, as shown in FIG. 8C, through-holes TH are formed by drilling or laser processing so as to penetrate through the structure of FIG. 8B (from the top copper foil 50b to the bottom copper foil 50b). As a result, cross sections of the first wiring layers 40 are exposed in the side surfaces of the through-holes TH.

Then, resin smears remaining in the second via holes VH2 and the through-holes TH are removed by desmearing of, for example, a permanganic acid method (cleaning).

Then, seed layers of copper, for example, are formed on both surfaces of the structure of FIG. 8C and the inside surfaces of the through-holes TH by electroless plating. Then, metal layers are formed of copper, for example, are formed by electrolytic plating using the seed layers as plating electricity supply paths.

Figure 9A:
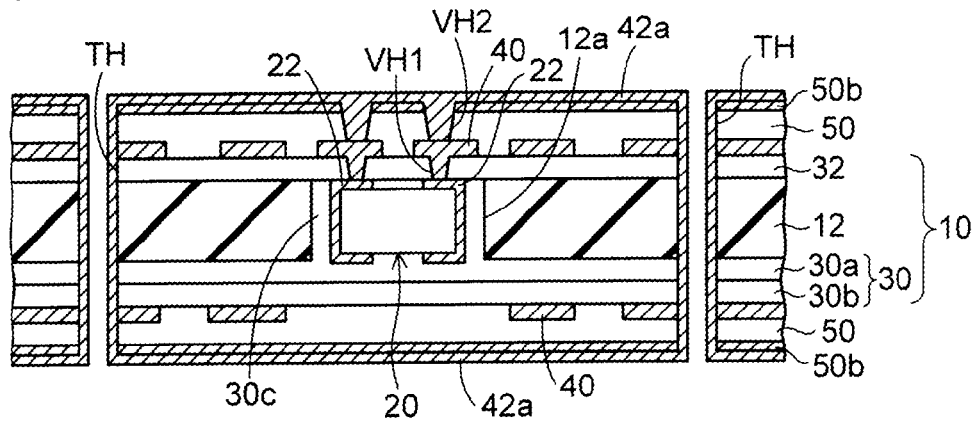
FIGS. 9A-9C are sectional views showing a manufacturing method of an electronic component built-in substrate according to an embodiment.
Figure 10:
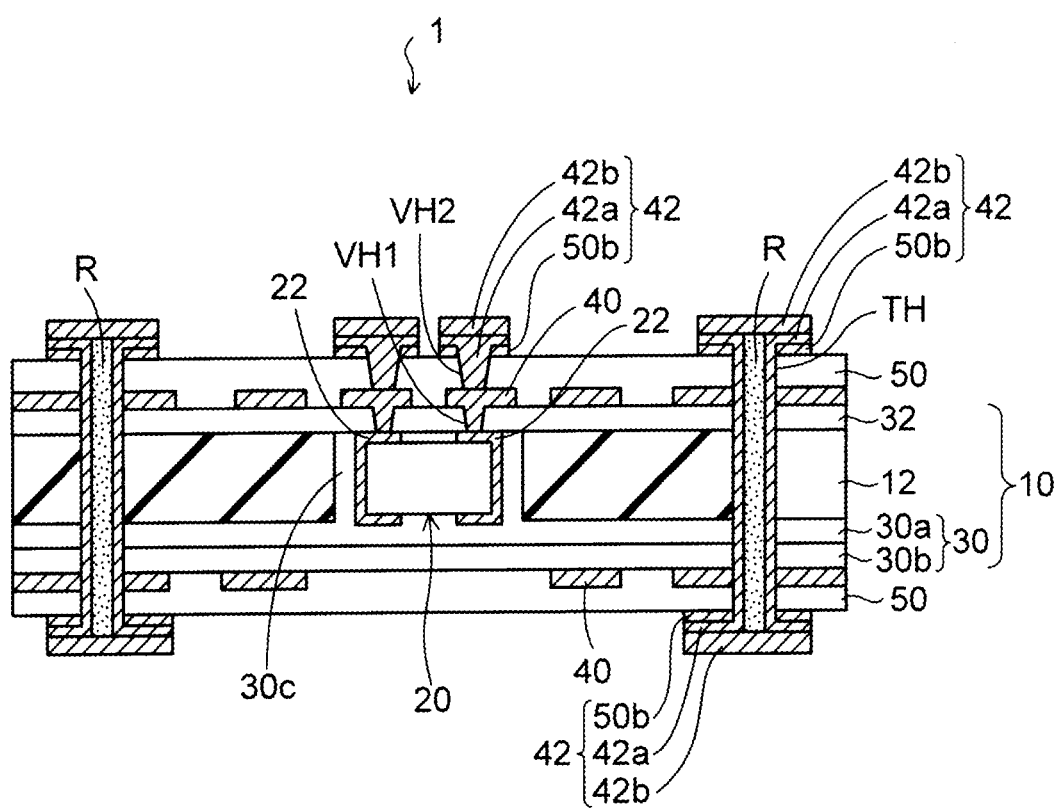
FIG. 10 is a sectional view of the electronic component built-in substrate according to the embodiment.

As a result, as shown in FIG. 9A, first metal plating layers 42a are formed on both surfaces of the structure of FIG. 8C and the inside surfaces of the through-holes TH and also within the second via holes VH2. In each through-hole TH, the first metal plating layer 42a is electrically connected to the exposed cross section of the first wiring layer 40.

Figure 9B:
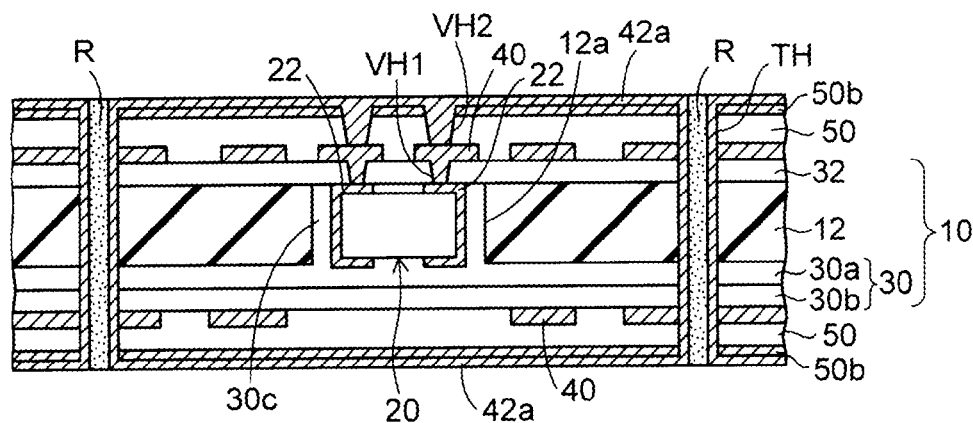

Then, as shown in FIG. 9B, the remaining spaces of the through-holes TH are filled with respective resin bodies R and excess resin that sticks out of the through-holes TH is polished away on both surface sides of the core member 12.

As a result, on each surface side of the core member 12, the outside surfaces of the resin bodies R formed in the respective through-holes TH are made flush with the surface of the first metal plating layer 42a and the surface of the structure of FIG. 9B is flattened. Then, the surfaces of the first metal plating layers 42a located on both surface sides of the core member 12 are cleaned by desmearing.

Figure 9C:
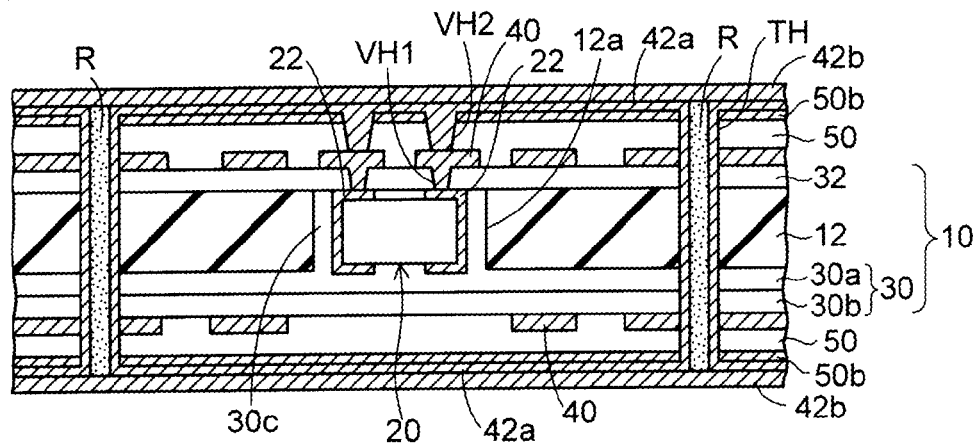

Then, as shown in FIG. 9C, second metal plating layers 42b are formed on the first metal plating layers 42a which are formed on both surfaces of the structure of FIG. 9B, by a step that is similar to the step of FIG. 9A. Then, on each surface side of the core member 12, the second metal plating layer 42b, the first metal plating layer 42a, and the copper foil 50b are patterned by photolithography and etching.

As a result, as shown in FIG. 10, a second wiring layer 42 is formed on the first insulating layer 50 on each surface side of the core member 12. The second wiring layer 42 is formed in such a manner that the copper foil 50b, the first metal plating layer 42a, and the second metal plating layer 42b which are laid in this order from the bottom.

On the top surface side of the core member 12, the second wiring layer 42 is connected to the first wiring layer 40 through the second via holes VH2. The second wiring layers 42 located on both surface sides of the core member 12 are connected to each other by the first metal plating layers 42a formed on the side surfaces of the through-holes TH. An electronic component built-in substrate 1 according to the embodiment is thus completed.

Where a large core member 12 for manufacture of many products is used, it is divided so that individual electronic component built-in substrates 1 are obtained from respective product regions.

Although in the embodiment two wiring layers are formed on each surface side of the core member 12, the number of wiring layers can be determined arbitrarily. Solder resist layers may be formed as a topmost layer and a bottommost layer on both surface sides of the core member 12 so as to have openings over or under connection portions of the outermost wiring layers.

As shown in FIG. 10, in the electronic component built-in substrate 1 according to the embodiment, the core member 12 is disposed at the center in the thickness direction and the chip capacitor 20 is disposed in the opening 12a of the core member 12. The chip capacitor 20 is provided with the connection terminals 22 at both ends in the horizontal direction. The thickness of the core member 12 is approximately equal to the total thickness of the chip capacitor 20.

The bottom surface (first surface) of the core member 12 is formed with the first inner auxiliary insulating layer 30a, and the gap between the chip capacitor 20 and the side surfaces of the opening 12a of the core member 12 is filled with the filling resin portion 30c. The first outer auxiliary insulating layer 30b is laid on the first inner auxiliary insulating layer 30a, and the first inner auxiliary insulating layer 30a and the first outer auxiliary insulating layer 30b constitute the first auxiliary insulating layer 30.

In this manner, the first auxiliary insulating layer 30 which is formed on the bottom surface of the core member 12 is formed by laying plural resin layers and the filling resin portion 30c is formed by filling the opening 12a of the core member 12 with part of the first inner auxiliary insulating layer 30a which is in contact with the core member 12. The top surface (second surface) of the core member 12 is formed with the second auxiliary insulating layer 32.

The entire first surface and the entire second surface of the core member 12 are in direct contact with the first auxiliary insulating layer 30 and the second auxiliary insulating layer 32, respectively, and there is no wiring layer at each of their interfaces. The core member 12, the first auxiliary insulating layer 30, and the second auxiliary insulating layer 32 thus constitute the core substrate 10.

On the top surface side of the core member 12, the first via holes VH1 are formed through the second auxiliary insulating layer 32 so as to reach the connection terminals 22 of the chip capacitor 20. The one first wiring layer 40 which is connected to the connection terminals 22 of the chip capacitor 20 through the respective first via holes VH1 is formed on the second auxiliary insulating layer 32. The other first wiring layer 40 is formed on the first auxiliary insulating layer 30 which is formed on the bottom surface of the core member 12.

On the top surface side of the core member 12, the first insulating layer 50 is formed on the second auxiliary insulating layer 32 and the first wiring layer 40. The second via holes VH2 are formed through the first insulating layer 50 in its central region so as to reach the first wiring layer 40. The second wiring layer 42 which is connected to the first wiring layer 40 via the second via holes VH2 is formed on the first insulating layer 50 located on the top surface side of the core member 12.

The first wiring layer 40 located on the top surface side of the core member 12 functions as a stopper layer for high-power laser processing in a step of forming the via holes VH2, whereby the connection terminals 22 of the chip capacitor 20 can be protected from the laser processing. To this end, the thickness of the first wiring layer 40 is set greater than that of the connection terminals 22 of the chip capacitor 20.

The first insulating layer 50 located on each surface side of the core member 12 is formed by heat-pressing a copper-foil-attached prepreg CP. Therefore, each second wiring layer 42 includes the copper foil 50b (metal foil) and is formed by laying the first metal plating layer 42a and the second metal plating layer 42b on the copper foil 50b.

On the bottom surface side of the core member 12, the first insulating layer 50 is formed on the first auxiliary insulating layer 30 and the first wiring layer 40.

Furthermore, the through-holes TH are formed through the electronic component built-in substrate 1 (from the top-surface-side first insulating layer 50 to the bottom-surface-side first insulating layer 50) at the positions close to its two respective ends. The portions, formed on the top-surface-side and bottom-surface-side first insulating layers 50 over or under each through-hole TH, of the second wiring layers 42 are connected to each other by the first metal plating layer 42a formed on the side surface of the through-hole TH, and are also connected to the corresponding portions of the first wiring layers 40 by the first metal plating layer 42a formed on the side surface of the through-hole TH.

As described above, in the manufacturing method of an electronic component built-in substrate according to the embodiment, the thickness of the core member 12 is set approximately equal to the total thickness of the chip capacitor 20. Therefore, when the space around the chip capacitor 20 which is disposed in the opening 12a of the core member 12 is filled up by heat-pressing the resin film 30x, only a small space needs to be filled up.

As a result, the space around the chip capacitor 20 can be filled with resin reliably without forming any interstices by heat-pressing the thin resin film 30x with a weak pressing force. Since the pressure acting on the chip capacitor 20 is low, the chip capacitor 20 can be prevented from being peeled off the temporary attachment tape 18 and inclined.

The core substrate 10 can be given a desired thickness by compensating for the shortage of the thickness of the core member 12 by forming the first auxiliary insulating layer 30 and the second auxiliary insulating layer 32. This makes it possible to satisfy a design specification including an item relating to impedance matching of a transmission path.

The thick first wiring layer 40 is formed over the connection terminals 22 of the chip capacitor 20 with the first via holes VH1 (formed through the second auxiliary insulating layer 32) interposed in between. The first insulating layer 50 to which the copper foil 50b is bonded is formed by laying the copper-foil-attached prepreg CP on the first wiring layer 40.

With this structure, the thick first wiring layer 40 functions as a stopper layer for the laser processing when the via holes VH2 are formed through the copper foil 50b and the first insulating layer 50 made of prepreg 50a by the leaser processing using a high power laser. Since the connection terminals 22 of the chip capacitor 20 are protected by the first wiring layer 40, they are not damaged by the laser processing.

As a result, the connection terminals 22 of the chip capacitor 20 are electrically connected to the first wiring layer 40 and the second wiring layer 42 with high reliability.

As described above, the embodiment makes it possible to manufacture, at a high yield, an electronic component built-in substrate which exhibits desired characteristics of a design specification and to increase its reliability.

Figure 11:
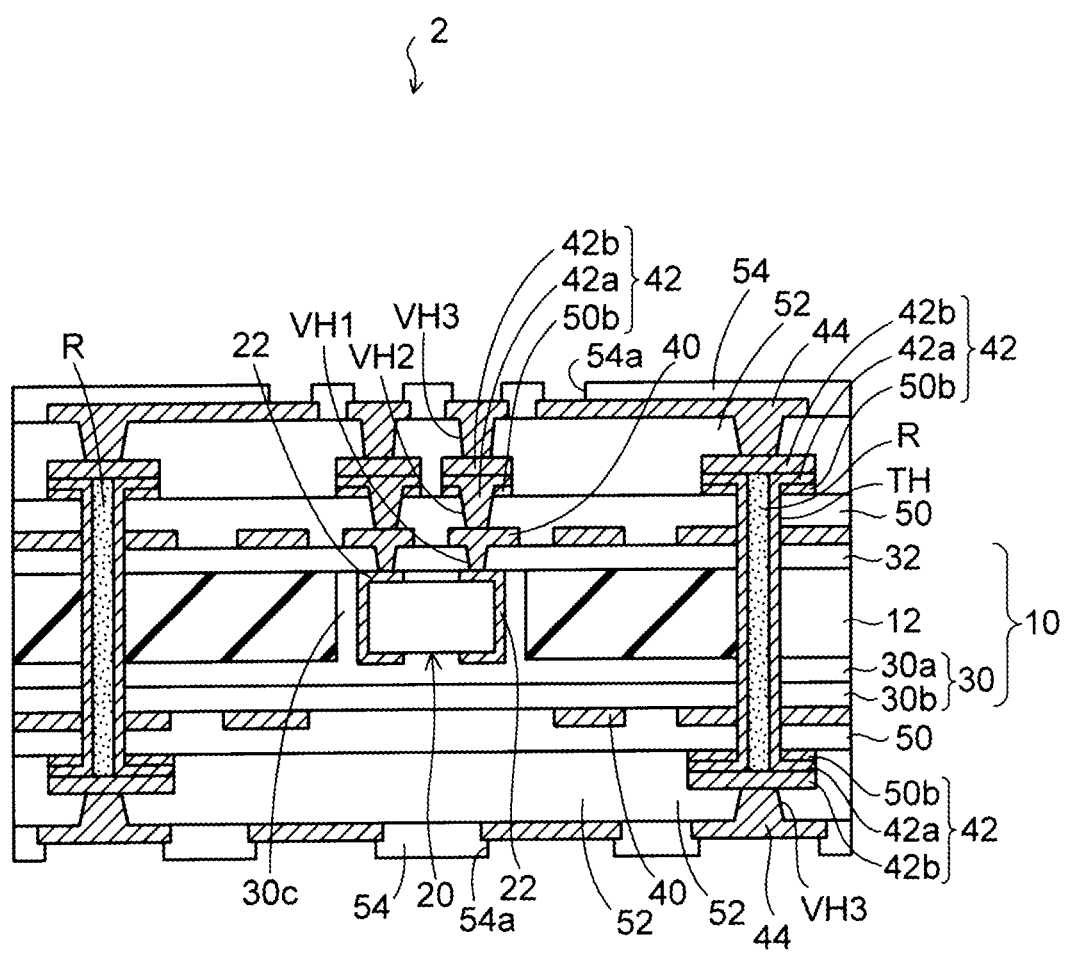
FIG. 11 is a sectional view of another electronic component built-in substrate according to the embodiment.

FIG. 11 shows an electronic component built-in substrate 2 which is suitably used in the case where a semiconductor chip is connected to the top wiring layer. In the electronic component built-in substrate 2 shown in FIG. 11, second insulating layers 52 are formed on the two respective surfaces of the electronic component built-in substrate 1 shown in FIG. 10.

Each second insulating layer 52 is formed by laying a resin film made of an epoxy resin, a polyimide resin, or the like. Third via holes VH3 are formed through each second insulating layer 52 so as to reach the second wiring layer 42. The third via holes VH3 are formed by laser-processing each second insulating layer 52.

A third wiring layer 44 is formed on the second insulating layer 52 that is formed on each surface side of the core member 12 so as to be connected to the second wiring layer 42 through the third via holes VH3. Each third wiring layer 44 is formed by a semi-additive method, for example.

A solder resist 54 is formed on the second insulating layer 52 that is formed on each surface side of the core member 12 so as to have openings 54a at positions corresponding to pads of the third wiring layer 44. If necessary, contact layers (not shown) such as nickel/gold plating layers are formed on the respective pads of the third wiring layer 44 formed on each surface side of the core member 12. The number of wiring layers can be determined arbitrarily.

Figure 12:
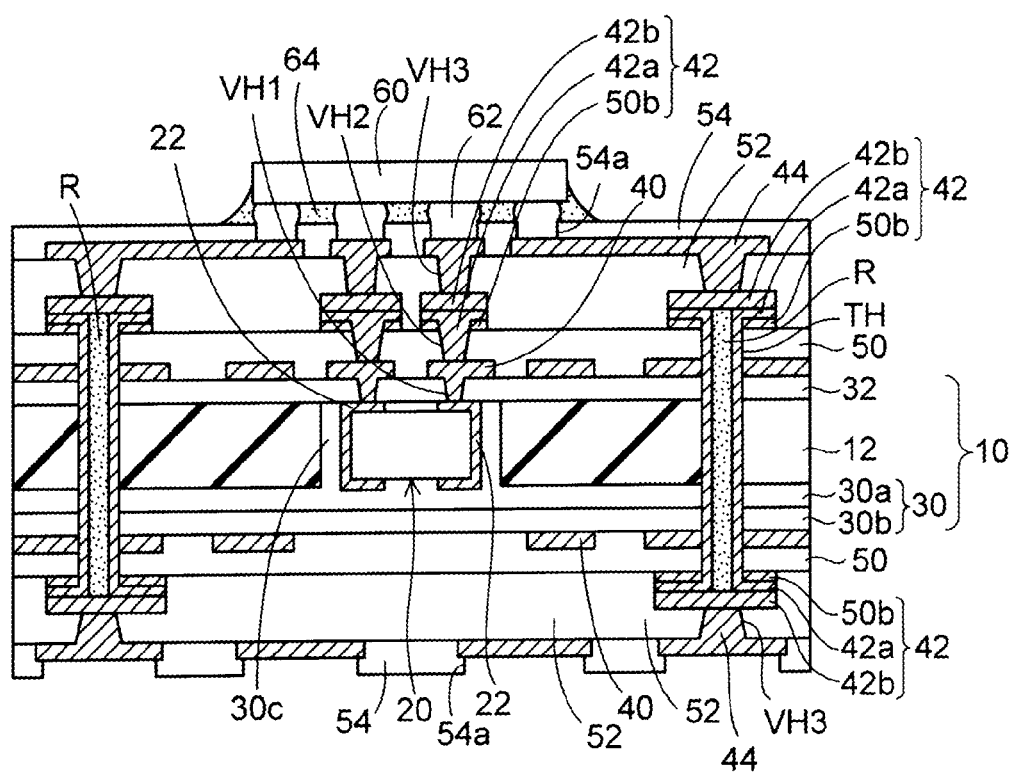
FIG. 12 is a sectional view of a semiconductor chip mounted on the electronic component built-in substrate shown in FIG. 11.

As shown in FIG. 12, bump electrodes 62 of a semiconductor chip 60 are flip-chip-connected to the respective pads of the top-surface-side third wiring layer 44 of the electronic component built-in substrate 2 of FIG. 11. The space under the semiconductor chip 60 is filled with an underfill resin 64.

Various aspects of the subject-matter described herein are set out non-exhaustively in the following numbered clauses:

1. A manufacturing method of an electronic component built-in substrate comprising:
    forming an opening through a core member;
    mounting an electronic component having a connection terminal in the opening of the core member;
    forming a first auxiliary insulating layer on a first surface of the core member, and filling a gap between the electronic component and a side surface of the opening of the core member with a filling resin portion;
    forming a second auxiliary insulating layer on a second surface of the core member;
    forming a first via hole through the second auxiliary insulating layer so that the first via hole reaches the connection terminal of the electronic component; and
    forming a first wiring layer on the second auxiliary insulating layer so that the first wiring layer is connected to the connection terminal of the electronic component through the first via hole, wherein
    the whole of the first surface and the whole of the second surface of the core member are in direct contact with the first auxiliary insulating layer and the second auxiliary insulating layer, respectively, and the core member, the first auxiliary insulating layer, and the second auxiliary insulating layer constitute a substrate.

2. The manufacturing method of an electronic component built-in substrate according to clause 1, wherein the thickness of the core member is approximately equal to that of the electronic component.

3. The manufacturing method of an electronic component built-in substrate according to clause 1 or 2, wherein:
    the electronic component mounting comprises bonding a temporary attachment tape to the second surface of the core member, and mounting the electronic component on a portion, covering the opening of the core member, of the temporary attachment tape, and
    the temporary attachment tape is removed after execution of the gap filling.

4. The manufacturing method of an electronic component built-in substrate according to clause 1 or 2, comprising: after the first wiring layer forming,
    forming an insulating layer on the second auxiliary insulating layer;
    forming a second via hole so that the second via hole reaches the first wiring layer; and
    forming a second wiring layer on the insulating layer so that the second wiring layer is connected to the first wiring layer through the second via hole.

5. The manufacturing method of an electronic component built-in substrate according to clause 4, wherein:
    the insulating layer is formed by heat-pressing a metal-foil-attached prepreg, with a metal foil kept bonded to the insulating layer;
    the second via hole is formed by laser-processing the metal foil and the insulating layer; and
    the second wiring layer includes the metal foil.

6. The manufacturing method of an electronic component built-in substrate according to clause 1 or 2, wherein the thickness of the first wiring layer is greater than that of the connection terminal of the electronic component.

7. The manufacturing method of an electronic component built-in substrate according to clause 1 or 2, wherein:
    the first auxiliary insulating layer is formed by laying a plurality of resin layers one on another, and
    the filling resin portion is formed by filling the opening of the core member with part of the resin layer, being in contact with the core member, of the first auxiliary insulating layer.

8. The manufacturing method of an electronic component built-in substrate according to clause 1 or 2, wherein the electronic component is a chip capacitor.

What is claimed is:
1. An electronic component built-in substrate comprising:
    an electronic component having a connection terminal;
    a substrate having a core member with an opening in which the electronic component is disposed, a first auxiliary insulating layer formed on a first surface of the core member; and a second auxiliary insulating layer formed on a second surface of the core member, the second auxiliary insulating layer having a first via hole that reaches the connection terminal of the electronic component;
    a filling resin portion filling a gap between the electronic component and a side surface of the opening of the core member; and
    a first wiring layer formed on the second auxiliary insulating layer and connected to the connection terminal of the electronic component through the first via hole,
    wherein the whole of the first surface and the whole of the second surface of the core member are in direct contact with the first auxiliary insulating layer and the second auxiliary insulating layer, respectively, the first auxiliary insulating layer and the filling resin portion are integrally formed of a same resin, the first auxiliary insulating layer includes a plurality of resin layers, and the first auxiliary insulating layer includes the filling resin portion as part of one of the plurality of resin layers of the first auxiliary insulating layer that is in contact with the core member.

2. The electronic component built-in substrate according to claim 1, wherein the first auxiliary insulating layer and the filing resin portion are integrally formed to be continuous with one another.

3. The electronic component built-in substrate according to claim 1, wherein a thickness of the core member is approximately equal to that of the electronic component.

4. The electronic component built-in substrate according to claim 1, wherein a thickness of the first wiring layer is greater than that of the connection terminal of the electronic component.

5. The electronic component built-in substrate according to claim 1, wherein the electronic component is a chip capacitor.

6. The electronic component built-in substrate according to claim 1, further comprising:
   an insulating layer formed on the second auxiliary insulating layer and having a second via hole that reaches the first wiring layer; and
   a second wiring layer formed on the insulating layer and connected to the first wiring layer through the second via hole.

7. The electronic component built-in substrate according to claim 6, wherein:
   the insulating layer is made of a resin containing a fiber reinforcement member, and
   the second wiring layer includes a metal foil.

* * * * *